United States Patent
Yoshizawa

(10) Patent No.: US 7,099,806 B2
(45) Date of Patent: Aug. 29, 2006

(54) SIZING PROCESSING SYSTEM AND COMPUTER PROGRAM FOR THE SAME

(75) Inventor: Keiji Yoshizawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 789 days.

(21) Appl. No.: 10/134,842

(22) Filed: Apr. 29, 2002

(65) Prior Publication Data

US 2002/0181796 A1 Dec. 5, 2002

(30) Foreign Application Priority Data

May 30, 2001 (JP) .............................. 2001-163142

(51) Int. Cl.
*G06F 17/50* (2006.01)

(52) U.S. Cl. .............................. 703/2; 703/13; 703/14; 716/19; 716/20

(58) Field of Classification Search ................ 703/2, 703/13–14; 716/19–20
See application file for complete search history.

(56) References Cited

U.S. PATENT DOCUMENTS 6,957,176 B1 * 10/2005 Yoshizawa ..................... 703/2

FOREIGN PATENT DOCUMENTS

JP 05-334395 * 12/1993

* cited by examiner

*Primary Examiner*—Hugh Jones
(74) *Attorney, Agent, or Firm*—Paul and Paul

(57) ABSTRACT

A sizing processing system according to the present invention generates an offset figure based on an offset point set obtained by offsetting the respective sides of a source figure by a distance equal to a prescribed sizing amount. When an inside-out side is detected on the offset figure, two sides of the source figure that intersect at a vertex thereof associated with the detected inside-out side are translated by a distance equal to the prescribed sizing amount, and the respective end points of the thus translated sides corresponding to that vertex are taken as offset points. Then, the offset points are added to the offset point set to generate an offset figure that does not entail the generation of an inside-out side. This can also address the problem of an inside-out side that occurs when an edge cut is inserted in the offset figure.

6 Claims, 16 Drawing Sheets

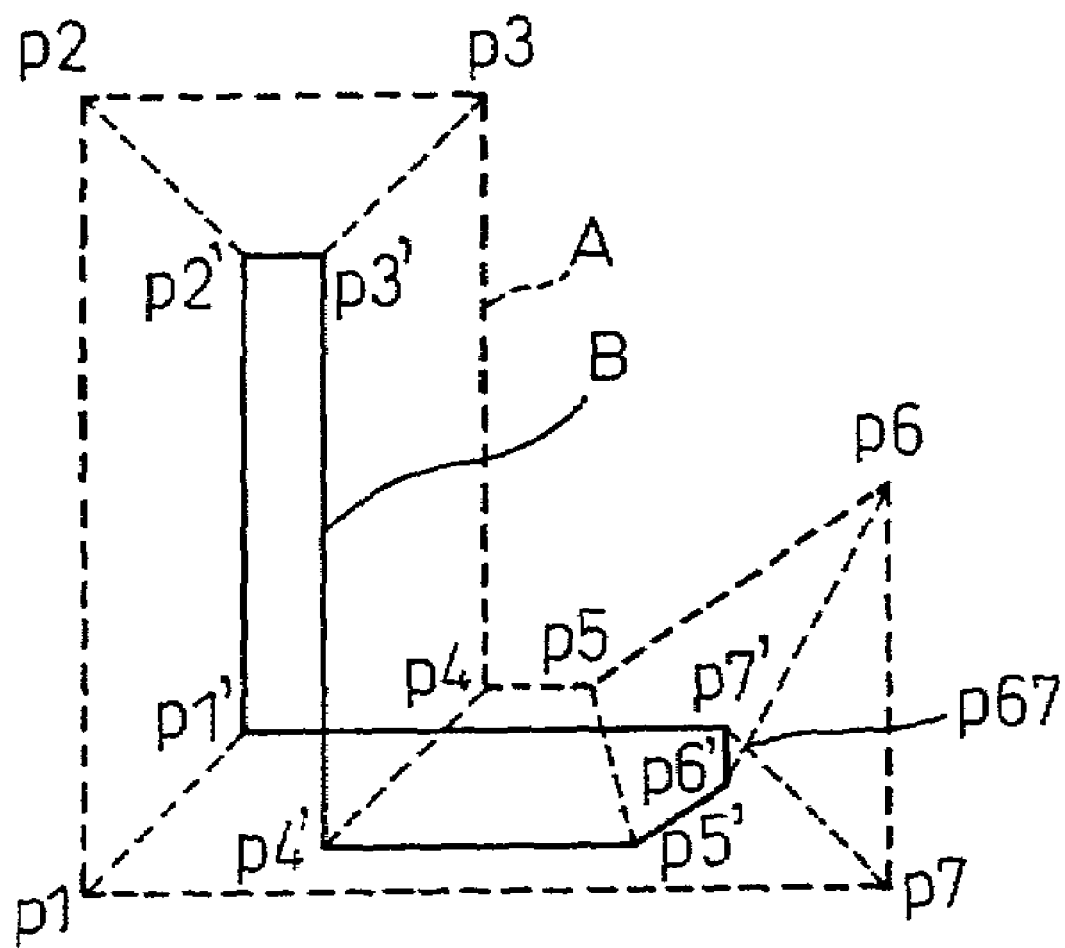

SIZING PROCESSING SYSTEM AND COMPUTER PROGRAM FOR THE SAME

BACKGROUND OF THE INVENTION

1. Field of the Invention

The present invention relates to a system for applying sizing processing to a geometric figure, and a computer program for the same; more particularly, the invention relates to a sizing processing system wherein, when occurrence of an inside-out side is detected on an offset figure generated by applying sizing processing to a source figure, an offset figure that avoids the generation of the inside-out side is generated for the portion where the inside-out side has occurred, and a computer program for the same.

2. Description of the Related Art

With increasing integration of LSIs, CAD systems are increasingly used to design LSI circuits. In particular, for an artwork system used to produce a mask pattern when designing a circuit, geometric computation capabilities are indispensable.

One such geometric computation capability is implemented by a sizing processing method which performs processing to shrink or enlarge a mask pattern, and this method is used for such purposes as verifying setting rules for minimum spacing and minimum width of the mask pattern, detecting regions where interconnection patterns can be formed, and removing notches and protrusions. In this sizing processing, the mask pattern is taken as an input source figure, and operations are performed to translate the peripheral sides of the source figure inwardly or outwardly of the figure by a specified distance so as to obtain a shrunken or enlarged geometric figure corresponding to the source figure. Here, the shrunken figure is obtained by shrinking the source figure, and the enlarged figure by enlarging the source figure, but the figure resulting from such processing is not always a simple geometrically figure similar to the source figure.

In the sizing processing for shrinking the source image, i.e., the reduction processing, an offset figure is generated by offsetting each vertex of the source figure inwardly of the figure and translating each side accordingly. When the amount of sizing by which to translate each side is changed, the degree of shrinking of the source figure changes; for example, when the amount of sizing is small, the resulting offset figure retains a shape relatively similar to the source figure, but when the amount of sizing is large, the offset figure appears squeezed.

In the sizing processing for enlarging the source image, i.e., the enlargement processing, an offset figure is generated by offsetting each vertex of the source figure outwardly of the figure and translating each side accordingly. When the amount of sizing by which to translate each side is changed, the degree of enlargement of the source figure changes; for example, when the amount of sizing is small, the resulting offset figure retains a shape close to the source figure, but when the amount of sizing is large, the offset figure may be enlarged to such a point that the shape changes at concave vertices. Here, since a protruding portion of the source figure further protrudes as a result of the enlargement processing applied to the source figure, if the protruding portion is not needed, an edge cut operation may be inserted to cut off the protruding portion.

Shrinkage or enlargement of an LSI mask pattern is performed using such sizing processing. Various methods have been proposed for the sizing processing.

Of the proposed sizing processing methods, a first sizing processing method includes offset processing and OR processing.

In the offset processing of the first sizing processing method, the respective sides forming the source figure are translated inwardly or outwardly by a distance equal to the amount of sizing, and an offset figure is generated by sequentially connecting the offset points to which the vertices of the source figure have been moved as a result of translating the respective sides of the source figure.

In the case of reduction processing, for a concave vertex of the source figure (a convex vertex in the case of enlargement processing) the two line segments intersecting at the vertex are each translated by a distance equal to the amount of sizing, and the intersection of the extended lines of the thus translated line segments is taken as its offset point, while for a convex vertex of the source figure (a concave vertex in the case of enlargement processing) the two line segments intersecting at the vertex are each translated by a distance equal to the amount of sizing, and the end points of the thus translated line segments corresponding to the original vertex are obtained, thus generating an offset point set consisting of three points, i.e., the end points and the concave intersection point. The offset figure for the source figure is generated by sequentially connecting the points in the thus obtained offset point set.

Next, the process proceeds to the OR processing. Here, by performing an OR operation on the above offset figure, a final geometric figure is extracted as the result of the sizing processing of the source figure.

In the first sizing processing method described above, the number of offset points forming the offset figure for the source figure increases as a result of the offset processing. This is because, in the case of reduction processing, two new offset points are generated for each convex vertex. As is apparent, as the number of offset points to be generated increases, the computer takes a longer time for processing, the calculation.

In view of this, a second sizing processing method is proposed as a sizing processing method that can reduce the number of offset points to be generated in the offset processing of the source figure.

The second sizing processing method is the same as the first sizing processing method in that it includes offset processing and OR processing, but differs in the details of the offset processing, i.e., the way in which the offset points are obtained.

In the offset processing, when an offset figure made up of offset points is generated by translating the respective sides of the source figure by a distance equal to the amount of sizing, there are cases where an "inside-out side" occurs in the offset figure. Since this inside-out side is not needed in the final offset figure, the inside-out side must be removed.

The inside-out side will be described below. When the line segment joining one vertex of the source figure to the corresponding vertex of the offset figure is designated an offset line segment, there are cases where two adjacent offset line segments intersect each other. That the two adjacent offset lines intersect each other means that when one side of the source figure is offset by a distance equal to a sizing amount, this affects the slope of its adjacent side of the source figure and causes the orientation of the side of the offset figure to be reversed from the orientation of the corresponding side of the source figure. The one side of the offset figure at the ends of which these two offset line segments terminate is called the "inside-out side". Normally, when a difference figure is obtained between the source figure and the offset figure generated as a result of the reduction processing, the difference figure should disappear, but because of the occurrence of the inside-out side, the difference figure does not disappear.

In the first sizing processing method, when the respective sides of the source figure are simply translated by a distance equal to a prescribed sizing amount, the offset point set corresponding to the source figure is generated in such a manner that for each convex vertex, three offset points including the vertex itself are generated in, for example, the case of reduction processing. In contrast, in the second sizing processing method, the offset point corresponding to one vertex is obtained as the intersection point of the two sides that are generated when the two sides of the source figure intersecting at that vertex are translated. For any other vertex of the source figure, the intersection point of the sides generated by translating the two sides intersecting at the vertex is taken as the offset point for that vertex. These points form an offset point set, and the offset figure is generated by connecting the points in the offset point set in the same order as the vertices of the source figure are arranged.

In the second sizing processing method, the number of offset points to be generated does not increase but, depending on the shape of the source figure, when two adjacent vertices are offset, the positions of the two offset points corresponding to the original vertices may be reversed from the positions of the original vertices, resulting in the inclusion of an inside-out side in a portion of the offset figure. If the OR processing is performed without removing this inside-out side, a correct result cannot be obtained. As a result, when the offset figure contains an inside-out side, the inside-out side must be removed from the offset figure.

Therefore, it is determined whether the offset figure contains an inside-out side; if an inside-out side is detected on the offset figure, the sides of the source figure associated with the inside-out side are translated by a distance equal to the prescribed sizing amount, and the intersection point of the translated sides is obtained. Then, the offset points at both ends of the inside-out side are removed from the offset point set forming the offset figure, and a new offset point set is created by adding the newly obtained intersection point in place of the removed offset points. A new offset figure is generated using the new point set. Next, the OR processing is performed on the newly generated offset figure. The OR processing is the same as that performed in the first sizing processing method.

According to the second sizing processing method, the number of offset points forming the offset figure can be greatly reduced, alleviating the computational burden in the OR processing, and even when an inside-out side occurs, the inside-out side can be easily removed.

There is also proposed a third sizing processing method that achieves faster computer processing by modifying the first sizing processing method.

In the third sizing processing method, when performing an offset operation on a convex vertex in reduction processing (concave vertex in the case of enlargement processing), if neither of the two sides of the source figure intersecting at that vertex contains an oblique line, the two sides intersecting at that vertex are respectively translated and the intersection point of the extended lines of the thus translated sides is simply taken as its offset point, rather than generating an offset point set consisting of three points associated with that vertex; on the other hand, if any one of the two sides intersecting at that vertex contains an oblique line, an offset point set consisting of three points associated with that vertex is generated.

The third sizing processing method achieves faster processing speed by adding a condition of whether an oblique line is included or not, but when such reduction processing that causes the figure to disappear is applied to the source figure, there arises the problem that, with the above added condition, a correct result cannot be obtained.

For example, consider a source figure that contains a plurality of convex vertices and one concave vertex and in which neither of the two sides intersecting at any vertex contain an oblique line, and consider the case where an offset point set is generated by applying the third reduction processing with a large sizing amount to the source figure and an offset figure is generated by sequentially connecting the offset points in the offset point set. In this case, when the OR processing is performed on the resulting offset figure, since reduction processing with such a sizing amount that causes the source figure to disappear is applied to the figure whose region has been offset, normally the figure should disappear. In actuality, however, a new region occurs in the generated offset figure. As a result, the third sizing processing method has the problem that when applying such reduction processing that causes the figure to disappear, a correct result cannot be obtained with the above added condition.

In the second sizing processing method, on the other hand, if an inside-out side occurs in the offset figure generated from a source figure containing convex vertices, the offset points associated with the inside-out side can be removed, and a new offset point can be added; as a result, the OR processing can be applied to the offset figure generated using the new offset point set.

However, when the source figure has a conspicuously protruding point, that is, when the angle between the sides of the source figure forming the protruding point is large, the offset figure can be obtained, but when the angle between the sides forming the protruding point is small, it is not easy to obtain a new offset point.

When sizing processing is applied to the source figure in accordance with the second sizing processing method, the determination of whether there is an inside-out side on the generated offset figure can be easily made by detecting an intersection point between adjacent offset locus line segments.

However, when removing the inside-out side, if the angle that the slopes of the sides of the source figure make at the protruding point is small, the offset sides generated by translating the above two sides also intersect at a small angle, and their intersection point is located far from the protruding vertex or nearly at infinity. In such cases, an overflow can occur when calculating the intersection point. If the calculation can be done in such a situation by limiting the number of significant digits, there remains the problem that a calculation error occurs.

Accordingly, it is an object of the present invention to provide a sizing processing system that can speed up offset processing without causing an overflow during calculation of an intersection point, can produce a correct result even when applying such reduction processing that deliberately causes a figure to disappear, and can easily obtain a correct sizing figure even when an edge cut is inserted in the processing of the figure.

SUMMARY OF THE INVENTION

To solve the above-enumerated problems, the present invention provides a sizing processing system for generating a sizing figure by applying sizing processing to a source figure, comprising: offset processing means for creating an offset point set by offsetting respective sides of the source figure by a distance equal to a prescribed sizing amount, and for generating an offset figure based on the offset point set; and inside-out side detecting means for detecting the occurrence of an inside-out side on the offset figure, and wherein: the offset processing means generates an offset figure that does not entail the generation of an inside-out side for a portion of the source figure that corresponds to the detected inside-out side.

When two adjacent offset locus line segments, each joining a vertex of the source figure to an offset point on the offset figure, intersect each other, the inside-out side detecting means determines that the offset figure contains an inside-out side associated with the line segments; the offset processing means translates two sides of the source figure intersecting at a vertex thereof associated with the inside-out side by a distance equal to the prescribed sizing amount, takes respective end points of the translated sides corresponding to the vertex as offset points, adds the offset points to the offset point set and, thereby, generates an offset figure that does not entail the generation of an inside-out side; and the offset processing means includes edge cut processing means for inserting an edge cut in the offset figure, wherein the edge cut processing means obtains an intersection point at which an edge cut line intersects the offset figure, and adds the intersection point as an offset point to the offset point set.

The present invention also provides a program for causing a computer to carry out sizing processing for generating a sizing figure by applying sizing processing to a source figure, comprising: an offset processing step for creating an offset point set by offsetting respective sides of the source figure by a distance equal to a prescribed sizing amount, and for generating an offset figure based on the offset point set; and an inside-out side detecting step for detecting the occurrence of an inside-out side on the offset figure, and wherein: in the offset processing step, an offset figure that does not entail the generation of an inside-out side is generated for a portion of the source figure that corresponds to the detected inside-out side.

When two adjacent offset locus line segments, each joining a vertex of the source figure to an offset point on the offset figure, intersect each other, the inside-out side detecting step determines that the offset figure contains an inside-out side associated with the line segments; the offset processing step translates two sides of the source figure intersecting at a vertex thereof associated with the inside-out side by a distance equal to the prescribed sizing amount, takes respective end points of the translated sides corresponding to the vertex as offset points, adds the offset points to the offset point set, and thereby generates an offset figure that does not entail the generation of an inside-out side; and the offset processing step includes an edge cut processing step for inserting an edge cut in the offset figure, where the edge cut processing step obtains an intersection point at which an edge cut line intersects the offset figure, and adds the intersection point as an offset point to the offset point set.

DESCRIPTION OF THE DRAWINGS

FIG. 16 is a diagram for explaining the occurrence of an inside-out side in an offset figure created in accordance with the second sizing processing method.

DETAILED DESCRIPTION OF THE INVENTION

Before describing the embodiments of the present invention, the related art and the disadvantages therein will be described with reference to the related figures.

Figure 11A:
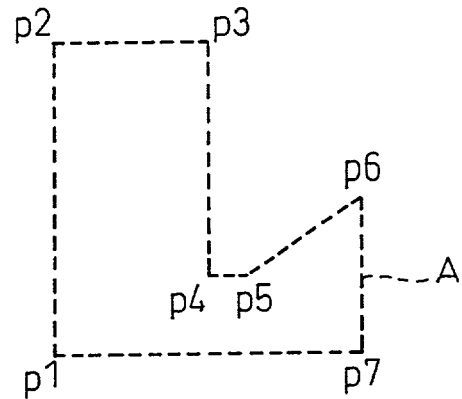
FIGS. 11A to 11C are diagrams for explaining the results of reduction processing and enlargement processing applied to a source figure.
Figure 11B:
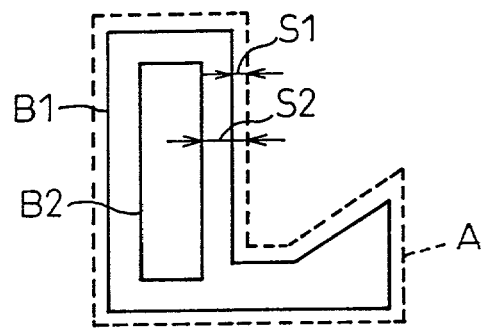
Figure 11C:
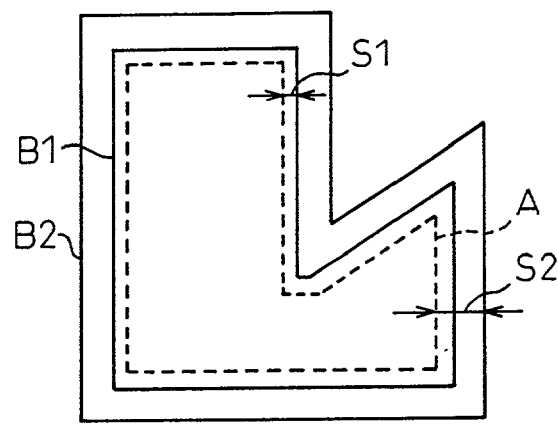

First, a typical example of sizing processing will be described. FIGS. 11A to 11C show geometric figures generated when sizing processing is applied to a source figure.

FIG. 11A shows one example of the source figure A to which the sizing processing is to be applied, and whose shape is shown by dashed lines. In the illustrated example, the source figure A has an set of vertices p1, p2, p3, p4, p5, p6, and p7, of which the vertices p4 are p5 are concave vertices and the other vertices are convex vertices.

Geometric figures generated by applying sizing processing to the source figure A are shown in FIGS. 11B and 11C. FIG. 11B shows the result of reduction processing, that is, the sizing processing for shrinking the source figure A, in which the vertices forming the source figure A are offset inwardly of the figure, thereby translating the respective sides to generate an offset figure.

The degree of shrinking of the source figure A changes when the amount of sizing, i.e., the distance by which each side is translated, is changed. When the amount of sizing is small (S1), the resulting offset figure B1 retains a shape relatively similar to the source figure A, but when it is large (S2), the figure appears squeezed as shown by the offset figure B2.

In FIG. 11C, as opposed to FIG. 11B, enlargement processing is applied by offsetting the vertices of the source figure A outwardly of the figure and translating the respectively side accordingly, to generate an offset figure.

In the case of FIG. 11C also, the degree of enlargement of the source figure A changes when the amount of sizing by which to translate each side is changed; when the amount of sizing is small (S1), the shape of the resulting offset figure B1 is close to that of the source figure A, but when it is large (S2), the source figure A is enlarged to a point where the shape changes at the concave vertices as shown by the offset figure B2.

Here, the convex vertex p6, for example, further protrudes as a result of the enlargement processing; therefore, when the source figure A is enlarged, if this protruding portion is not needed, an edge cut may be inserted to cut off this protruding portion.

Figure 12:
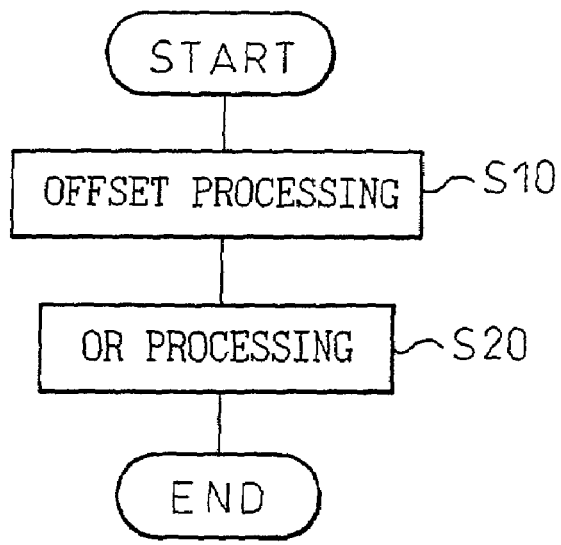
FIG. 12 is a flowchart for explaining a first sizing processing procedure according to the prior art.

Next, the first sizing processing method will be described with reference to FIGS. 12 to 14. FIG. 12 shows the processing flow of the first sizing processing method, which consists essentially of offset processing (step S10) and OR processing (step S20).

In the offset processing of step S10, an offset figure is created by translating the respective peripheral sides of the source figure inwardly or outwardly of the figure by a distance equal to the amount of sizing. For each vertex of the source figure, an offset point to which the vertex is offset as a result of the translation of its associated sides is generated in accordance with the attribute (convex or concave) of that vertex, and the offset figure is created by sequentially connecting the thus generated offset points.

Figure 13:
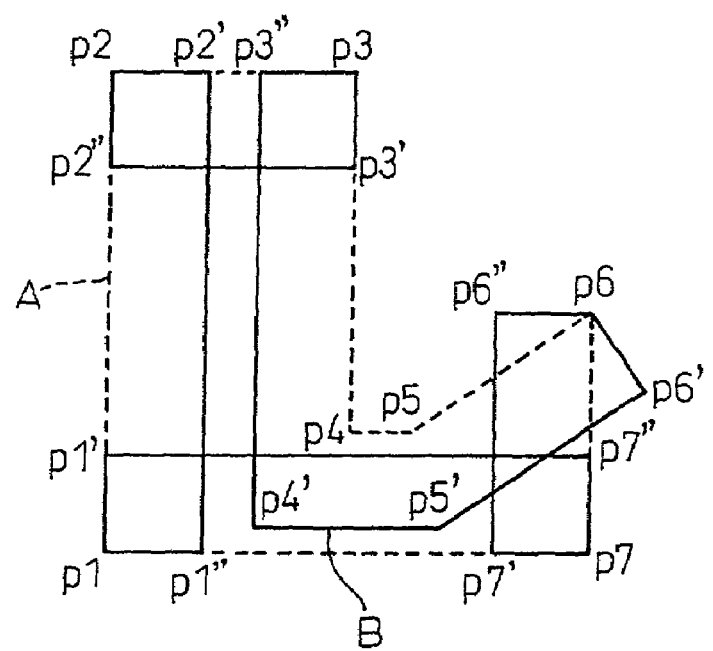
FIG. 13 is a diagram for explaining an offset figure created in accordance with the first sizing processing method.

A specific example of this offset processing is shown in FIG. 13. FIG. 13 illustrates an example of the reduction processing applied to the source figure A shown in FIG. 11B.

For each concave vertex of the source figure A, the two line segments intersecting at the vertex are each translated by a distance equal to the amount of sizing, and the intersection point of the extended lines of the translated line segments is taken as its offset point. For the concave vertex p4, for example, the line segments (p3, p4) and (p4, p5) intersecting at the vertex p4 are each translated by a distance equal to a prescribed sizing amount, and the intersection point p4' of their extended lines is taken as the offset point for the concave vertex p4. Likewise, for the concave vertex p5, an intersection point p5' is taken as its offset point.

On the other hand, for each convex vertex of the source figure A, the two line segments intersecting at the vertex are each translated by a distance equal to the amount of sizing, one end point of each translated line segment corresponding to the original vertex is obtained, and this end point is taken as the offset point for the convex vertex. In the case of a convex vertex, since the two line segments intersecting at the vertex each have an end point, there are two offset points for each convex vertex, and therefore, an offset point set consisting of three points, including the convex vertex itself, is formed.

In FIG. 13, when attention is paid to the convex vertex p1, for example, the line segments intersecting at the vertex p1 are the sides (p1, p2) and (p1, p7) of the source figure A, and when these sides are each translated by a distance equal to a prescribed sizing amount, line segments (p1", p2') and (p1', p7") result. On these line segments, the points to which the convex vertex p1 is offset by the sizing amount are points p1' and p1" each of which is a point corresponding to the convex vertex and corresponds to one end point of either one of the two line segments intersecting at that vertex.

Offset points for the convex vertices p2, p3, p6, and p7 are obtained in like manner.

The thus obtained offset point set corresponding to the vertex set of the source figure A consists of p1', p1, p1", p2', p2, p2", p3', p3, p3", p4', p5', p6', p6, p6", p7', p7, and p7", and the offset figure B, the result of offsetting the source figure A, is generated by sequentially connecting these offset points.

Next, the process proceeds to the OR processing in step S20, in which the OR processing is performed on the obtained offset figure to extract the final figure as the result of the sizing processing of the source figure.

The OR processing is a technique for extracting a boundary line separating a region where one or more geometric figures overlap from a region where there are no geometric figures, and this technique is applied to the offset figure B shown in FIG. 13. FIG. 14 shows how this technique is applied to the offset figure B.

When the offset points are sequentially connected to create an offset figure, a vector is formed between adjacent offset points, and the direction is given by the vector. When applying the OR processing to the figure, a line segment whose vector is directed, for example, in vertical direction, that is, in the Y-axis direction, is taken from the line segments forming the figure, and the number of overlaps in the region whose boundary coincides with that line segment is counted in accordance with the direction of the vector of the line segment. If the direction of the vector is the increasing direction of the Y-axis coordinates, the number is incremented by 1 for the region on the right-hand side of the line segment; if the direction is the decreasing direction, the number is decremented by 1 for that region. Regions where the number of overlaps is 1 or larger are taken to form the final figure, and the other regions are eliminated.

Figure 14:
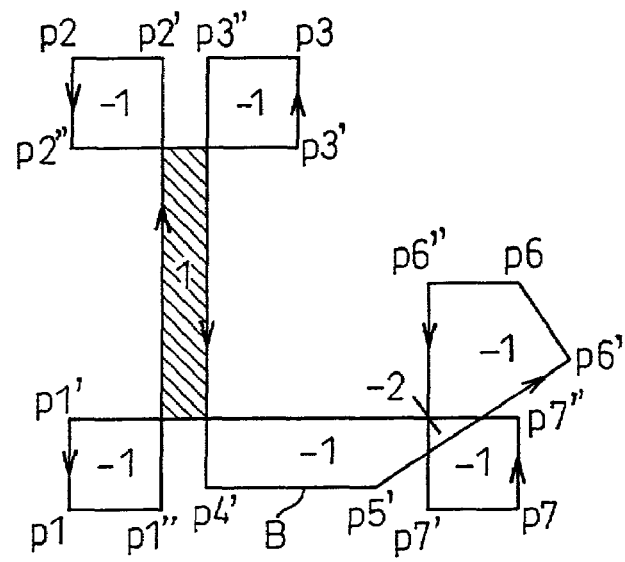
FIG. 14 is a diagram for explaining the result of the OR processing performed on the offset figure shown in FIG. 13.

When applying the OR processing to the offset figure B of FIG. 14, as the line segment (p1", p2') of the offset figure B, for example, is represented by an upward-directed vector, it is determined that there is an overlap on the right-hand side of that line segment, and the number is therefore incremented by 1. On the left-hand side, the number is 0. Further, as the line segment (p1', p1) is represented by a downward-directed vector, the number is decremented by 1 for the region on the right-hand side of the line segment. When attention is paid to the triangular region in the rightmost portion of the offset figure B, since the line segments (p3", p4') and (p6", p7') are both represented by a downward-directed vector, the number is decremented by 2 for that region.

The number of geometric figure overlaps is counted in the above manner for all the regions enclosed by the line segments forming the offset figure B. The results are shown in FIG. 14.

Then, the regions for which the counted number of overlaps is 1 or larger are extracted. In the example of FIG. 14, the region indicated by oblique hatching is extracted. Here, the coordinate values of the intersections of the line segments forming the oblique hatched region are obtained by calculation, to identify the region to be extracted. Next, the regions for which the number of overlaps is less than 1 are eliminated by deleting the offset points not associated with the oblique hatched region, and the final figure is thus extracted. The example of FIG. 14 corresponds to the geometric figure B2 shown in FIG. 11B.

The above has described the case where reduction processing is applied to the source figure A, but when applying enlargement processing to the source figure A, the geometric figure B1 or B2 shown in FIG. 11C can also be obtained using a similar procedure. In the case of enlargement processing, however, the way in which the attribute of each vertex of the source figure A is treated is the opposite of that in the reduction processing; that is, for a concave vertex, the two line segments intersecting at the vertex are translated and the end points of the thus translated line segments corresponding to the vertex are taken as the offset points, while for a convex vertex, the line segments intersecting at the vertex are translated and the intersection point of the extended lines of the thus translated line segments is taken as the offset point.

In the first sizing processing method described above, the number of offset points forming the offset figure generated by applying offset processing to the source figure is 17 in the example of FIG. 13. That is, the number of generated offset points increases because two new offset points are generated for each convex vertex in the case of reduction processing.

Next, the second sizing processing method, which can reduce the number of offset points to be generated when offset processing is applied to the source figure, will be described with reference to FIGS. 15 to 18.

Figure 15:
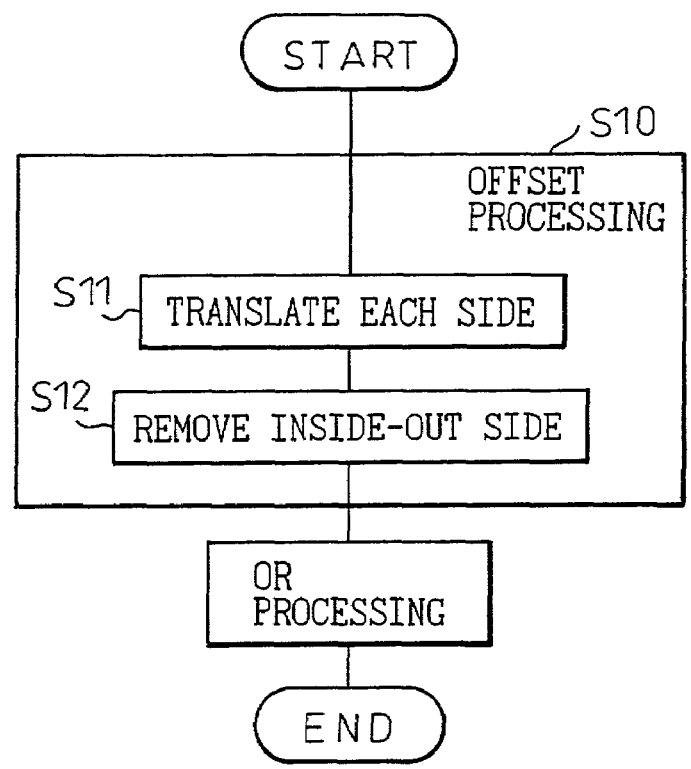
FIG. 15 is a flowchart for explaining a second sizing processing procedure.

FIG. 15 shows the processing procedure of the second sizing processing method. The second sizing processing method is the same as the first sizing processing method in that it includes offset processing and OR processing, but differs in the details of the offset processing, i.e., the way in which the offset points are obtained.

The offset processing of step S10 includes step S11, in which the respective sides of the source figure are translated by a distance equal to the amount of sizing to generate an offset figure made up of offset points, and step S12, in which if an inside-out side occurs in the offset figure, an offset figure with the inside-out side removed is generated.

The generation of these offset figures will be described by taking as an example the case where reduction processing such as shown in FIG. 11B is applied to the source figure A of FIG. 11A.

FIG. 16 shows the offset figure B generated by translating the respective sides of the source figure A by a distance equal to a prescribed sizing amount and by obtaining the offset points. In the second sizing processing method, the point at which the two sides intersecting at any given vertex intersect when translated is taken as the offset point for that vertex.

When the respective sides of the source figure A are simply translated by a distance equal to the prescribed sizing amount, the resulting offset figure is the same as the offset figure B shown in FIG. 13. For example, the two sides intersecting at the vertex p1, that is, the sides (p1, p2) and (p1, p7), are translated to the sides (p1", p2') and (p1', p7"), respectively. Here, in the case of the first sizing processing method, points p1' and p1" would be obtained as the offset points for the convex vertex p1, and an offset point set (p1', p1, p1"), including the vertex p1 itself, would be generated.

By contrast, in the second sizing processing method, the intersection point of the translated sides (p1", p2') and (p1', p7") is obtained as the offset point for the vertex p1. FIG. 16 shows how the offset points are generated. For example, the offset point for the vertex p1 is indicated at p1'. For the other vertices also, the point at which the two sides intersecting at any given vertex intersect when translated is taken as the offset point for that vertex, and thus the points p2', p3', p4', p5', p6', and p7' are respectively obtained. In FIG. 16, a dashed line joining each vertex to its corresponding offset point indicates an offset locus line segment along which the vertex has been moved by offsetting.

With these points as an offset point set, the offset figure B is generated by connecting the offset points in the same order as the vertices of the source figure are arranged. In the second sizing processing method, unlike the first sizing processing method, the way in which the offset points are obtained is the same for any vertex, regardless of its attribute.

However, in the second sizing processing method, depending on the shape of the source figure A, for example, in the case of FIG. 11A, when two adjacent vertices are offset, the positions of the two offset points corresponding to the original vertices may be reversed from the positions of the original vertices, resulting in the occurrence of an inside-out side in a portion of the offset figure. For example, in FIG. 16, the orientation of the side (p6', p7') of the offset figure is reversed from the orientation of the corresponding side (p6, p7) of the source figure A; here, the side (p6', p7') is the inside-out side.

Figure 17A:
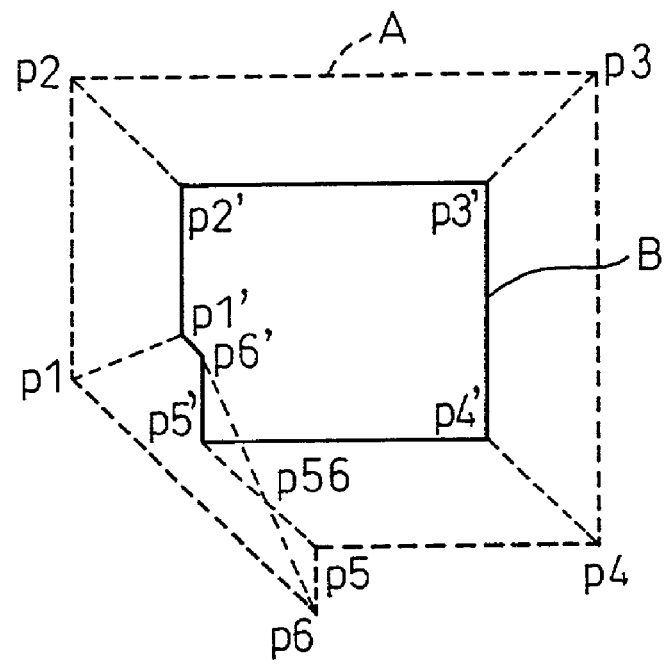
FIGS. 17A and 17B are diagrams for explaining another example of an inside-out side occurring in an offset figure created in accordance with the second sizing processing method.
Figure 17B:
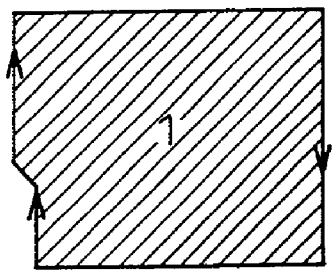

Further, in the case of the offset figure B obtained for the source figure A shown in FIG. 17A, for example, the side (p5', p6') is the inside-out side; if OR processing is performed without removing the inside-out side, a correct result cannot be obtained, as shown in FIG. 17B.

Therefore, if an inside-out side occurs in the offset figure B, the inside-out side is removed from the offset figure (step S12).

Here, the determination of whether there is an inside-out side on the offset figure B is made by detecting whether any two offset locus line segments, joining their associated two adjacent offset points to their respectively corresponding original vertices, intersect each other. If the two offset locus line segments intersect each other, it is determined that the side defined by these two offset points is an inside-out side. In FIG. 16, this intersection point is indicated at p67.

Figure 18:
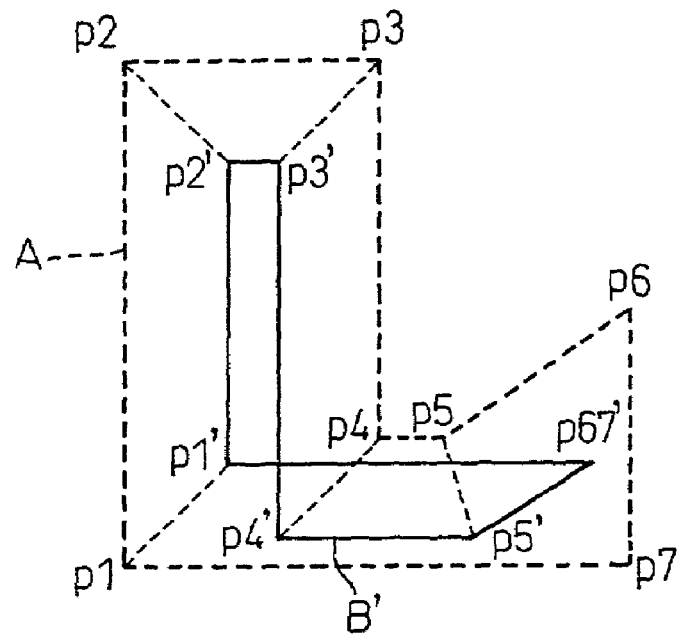
FIG. 18 is a diagram for explaining the result when the inside-out side is removed from the offset figure shown in FIG. 16.

If an inside-out side is detected on the offset figure B, the sides of the source figure corresponding to the inside-out side are translated by a distance equal to the prescribed sizing amount, and the intersection point of the translated sides is obtained. In the example shown in FIG. 16, the sides (p5, p6) and (p7, p1) adjacent to the side (p6, p7) of the source figure corresponding to the inside-out side (p6', p7')

are translated by a distance equal to the prescribed sizing amount, and the intersection point p67' shown in FIG. 18 is obtained as their intersection point.

The intersection point thus obtained being denoted as p67', as shown in FIG. 18, the offset points p6' and p7' are removed from the set of offset points p1', p2', p3', p4', p5', p6', and p7' forming the offset figure B. In place of the removed points, the intersection point p67' is added to construct a new offset point set consisting of p1', p2', p3', p4', p5', and p67', and a new offset figure B' is generated based on the new point set.

Figure 19:
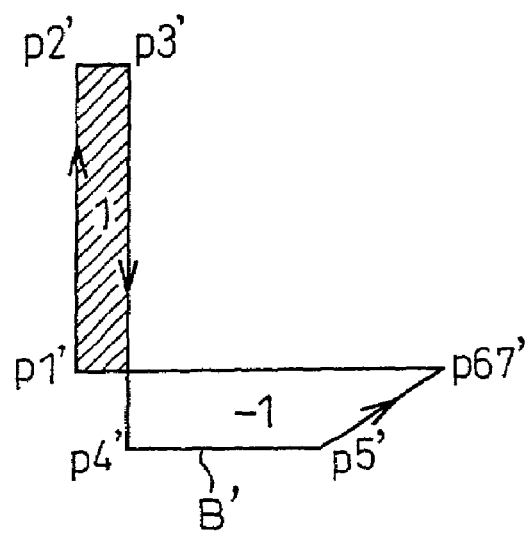
FIG. 19 is a diagram for explaining the result of the OR processing performed on the offset figure shown in FIG. 18.

The process then proceeds to step S20 where the OR processing is performed on the thus created offset figure B'. The result is shown in FIG. 19. As shown, the oblique hatched region remains, creating an offset figure similar to that shown in FIG. 11B. The OR processing is performed in a similar procedure to that applied in FIG. 14.

According to the second sizing processing method, as shown in FIG. 16, the number of offset points forming the offset figure can be greatly reduced, alleviating the computational burden in the OR processing, and even when an inside-out side occurs, the inside-out side can be easily removed.

The second sizing processing method has been described above by taking reduction processing as an example, but it will be appreciated that enlargement processing can also be performed using a similar procedure.

On the other hand, in the third sizing processing method, when performing an offset operation on a convex vertex, if neither of the two sides of the source figure intersecting at that vertex contains an oblique line, the two sides intersecting at that vertex are respectively translated and the intersection point of the extended lines of the thus translated sides is simply taken as its offset point, rather than generating an offset point set consisting of three points associated with that vertex; on the other hand, if any one of the two sides intersecting at that vertex contains an oblique line, an offset point set consisting of three points associated with that vertex is generated.

Figure 20A:
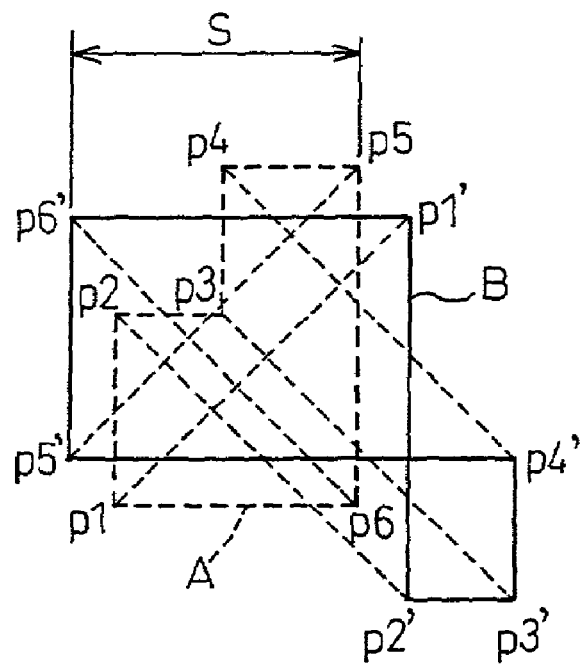
FIGS. 20A and 20B are diagrams for explaining the situation where, when OR processing is performed on an offset figure created by performing a third sizing processing method on a source figure, the figure does not disappear.

This method achieves faster processing speed by adding a condition of whether an oblique line is included or not, but when such reduction processing that causes the figure to disappear is applied, for example, to the source figure A shown in FIG. 20A, a correct result cannot be obtained with the above added condition.

For example, in the source figure A of FIG. 20A, vertices p1, p2, p4, p5, and p6 are convex vertices, and vertex p3 is a concave vertex; as shown, neither of the two sides intersecting at any given vertex contains an oblique line. When the third reduction processing with a large sizing amount is applied to the source figure A of this shape, offset points p1', p2', p3', p4', p5', and p6' are obtained, and an offset figure B can be obtained by sequentially connecting these offset points.

Figure 20B:
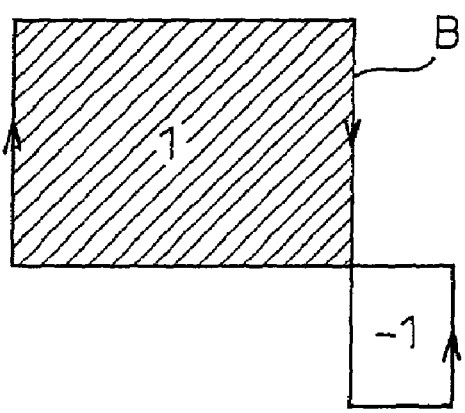

When the OR processing is applied to the resulting offset figure, the region indicated by oblique hatching remains as a result of the offsetting, as shown in FIG. 20B. However, as the reduction processing is applied using such a sizing amount that causes the figure to disappear, normally the figure should disappear, but in actuality, the oblique hatched region remains. Accordingly, in the third sizing processing method, when applying such reduction processing that causes the figure to disappear, a correct result cannot be obtained with the above added condition.

In the second sizing processing method, on the other hand, if the source figure A has a protruding point, for example, at vertex p6, as shown in FIG. 16, and as a result, an inside-out side occurs in the offset figure, the offset points associated with the inside-out side can be removed, and a new offset point can be added; as a result, the OR processing can be performed on the offset figure generated using the new offset point set.

Figure 21:
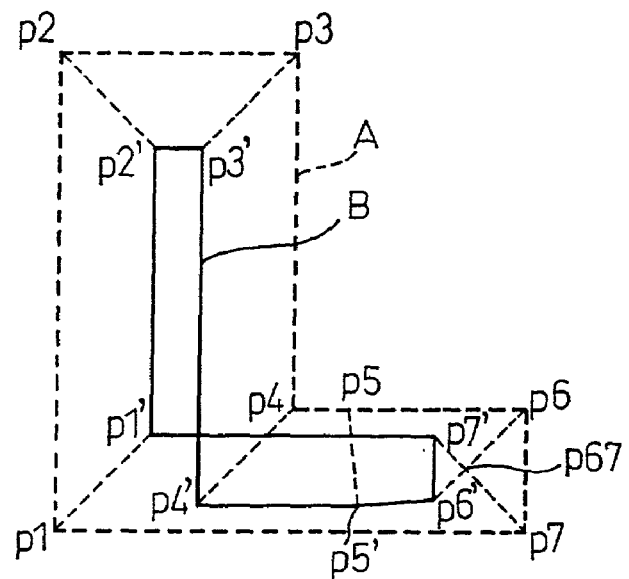
FIG. 21 is a diagram for explaining an offset figure generated by applying the second sizing processing to a source figure.

However, when the source figure A has a conspicuously protruding point as shown in FIG. 16, that is, when the angle between the sides (p5, p6) and (p7, p1) is large, the offset figure B' shown in FIG. 18 can be obtained, but when the angle between the sides (p5, p6) and (p7, p1) of the source figure A is small, as shown in FIG. 21, it is not easy to obtain a new offset point p67'.

The offset figure B can be generated by applying the second sizing processing to the source figure A of FIG. 21. The determination of whether there is an inside-out side on the offset figure B can be easily made by detecting the intersection point p67 between the adjacent offset locus line segments (p6, p6') and (p7, p7').

Figure 22:
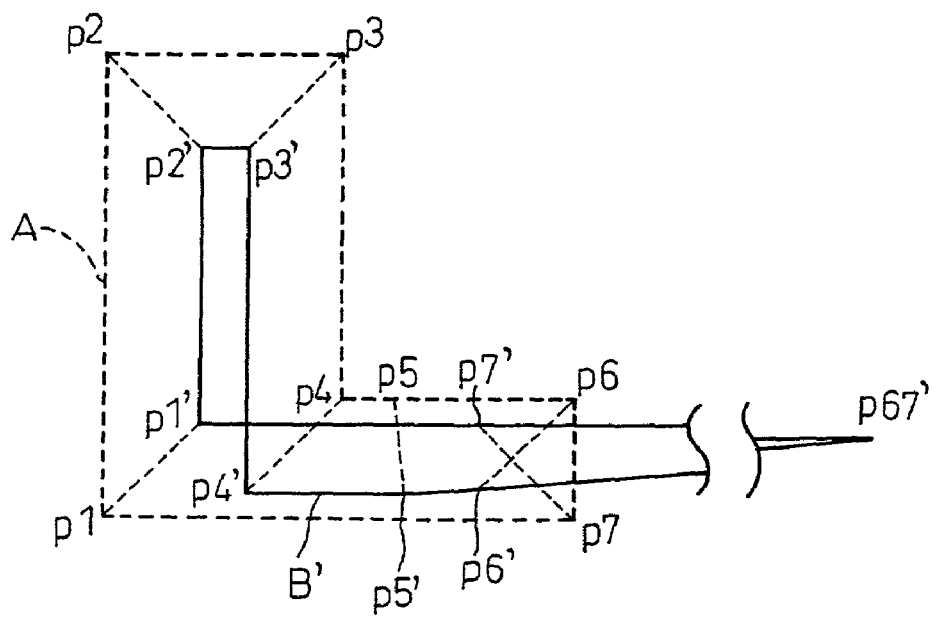
FIG. 22 is a diagram for explaining why it is difficult to remove the inside-out side from the offset figure shown in FIG. 21.

However, when removing the inside-out side (p6', p7'), if the angle that the slopes of the sides (p5, p6) and (p7, p1) of the source figure make is small, the sides (p5', p6') and (p7', p1') generated by translating the above two sides also intersect at a small angle, and their intersection point p67' is located at a far point or nearly at infinity, as shown in FIG. 22.

In such cases, an overflow can occur when calculating the intersection point p67' in FIG. 22. If the calculation can be done in such a situation by limiting the number of significant digits, a calculation error occurs.

Accordingly, the present invention aims to provide a sizing processing system that can speed up offset processing without causing an overflow during calculation of an intersection point, can produce a correct result even when applying such reduction processing that deliberately causes a figure to disappear, and can easily obtain a correct sizing figure even when an edge cut is inserted in the processing of the figure. Next, a first and a second embodiment of the sizing processing system using the sizing processing method of the present invention will be described with reference to FIGS. 1 to 9.

EMBODIMENT 1

In the first sizing processing method described above, the offset figure is generated by processing every convex vertex in the case of reduction processing, or every concave vertex in the case of enlargement processing, in such a manner as to avoid the occurrence of an inside-out side relative to the source figure, while in the second sizing processing method, the offset figure is generated by removing an inside-out side if it occurs. Any of the above sizing processing methods, however, involves its own problem as described above.

In view of this, the sizing processing method according to this embodiment, while based on the second sizing processing method, first determines whether an inside-out side can actually occur during the sizing processing, then generates an offset figure avoiding the generation of an inside-out side only for a portion where it is determined that an inside-out side occurs, and finally generates an entire offset figure.

Figure 1:
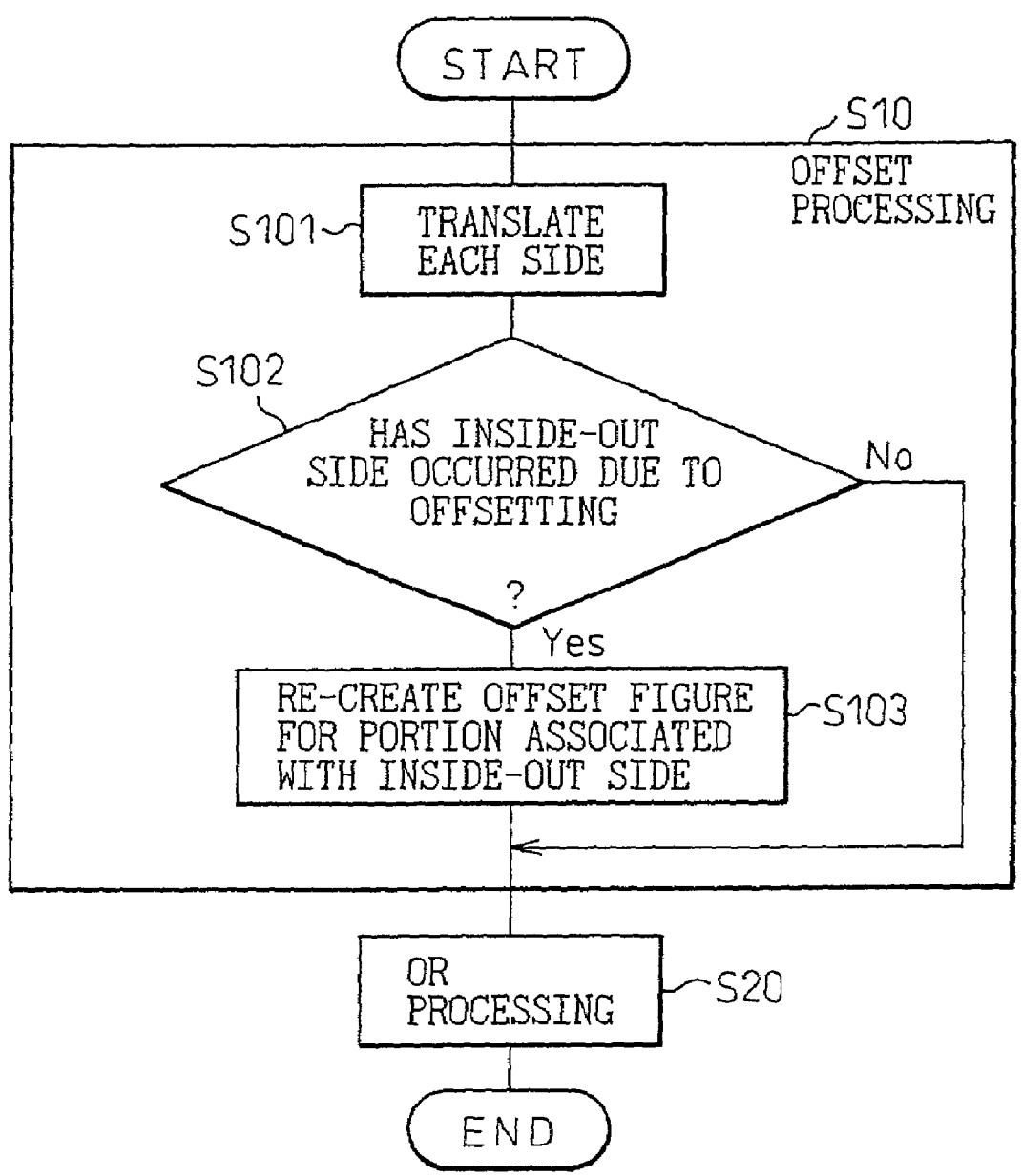
FIG. 1 is a flowchart for explaining a sizing processing procedure according to a first embodiment of the present invention.

FIG. 1 shows a flowchart illustrating the processing method used in the sizing processing system according to this embodiment.

In the offset processing (step S10) in the sizing processing method of this embodiment, first the respective sides of the source figure are translated by a distance equal to a prescribed sizing amount, and the point at which the two sides intersecting at any given vertex on the source figure is obtained as the offset point for that vertex (step S101).

Next, offset locus line segments, each joining one original vertex to the corresponding offset point obtained for that vertex, are examined to detect whether any two adjacent offset locus line segments intersect each other, thereby determining whether an inside-out side has occurred in the offset figure defined by the offset point set (step S102).

If there is a portion containing an inside-out side in the offset figure (Yes), an offset point for generating an offset figure that avoids the generation of the inside-out side in that portion is obtained, and an offset figure is created by generating an offset point set corresponding to the source figure (step S103).

This completes the offset processing for the source figure, and the OR processing is performed on the created offset figure to obtain the figure that remains (step S20).

The sizing processing method of this embodiment will be described below by taking as an example the case in which the method is applied to the source figure A shown in FIG. 11A.

First, the respective sides of the source figure A are translated by a distance equal to the prescribed sizing amount, and the point at which the two sides intersecting at any given vertex of the source figure intersect when translated is obtained as the offset point for that vertex; then, the thus obtained offset points are sequentially connected. The result is shown as the offset figure B of FIG. 16 defined by a set of points p1', p2', p3', p4', p5', p6', and p7'. Here, the offset figure B is temporarily generated by connecting the offset points in the same order as the vertices of the source figure A are arranged.

However, as earlier described, depending on the shape of the source figure A, when two adjacent vertices are offset, there can occur cases where the positions of the two offset points corresponding to the original vertices are reversed from the positions of the original vertices, resulting in the occurrence of an inside-out side in a portion of the offset figure. For example, in FIG. 16, the side (p6', p7') is the inside-out side.

It is determined here whether there is an inside-out side on the offset figure B. This determination is made by examining each offset locus line segment joining one original vertex to its corresponding offset point, and thereby determining whether any two adjacent offset locus line segments intersect each other. If two offset locus line segments intersect, it is determined that the side defined by the two offset points is an inside-out side. In the offset figure B shown in FIG. 16, the point p67 is detected as such an intersection point. In practice, such an intersection point can be detected directly based on the offset locus line segments without actually creating the offset figure B.

In the second sizing processing method, an operation for removing the inside-out side (p6', p7') was performed based on the detection of the point p67; in contrast, in the sizing processing method of this embodiment, when the point p67 is detected, an operation for generating an offset figure avoiding the inside-out side is performed on the vertices of the source figure A associated with the inside-out side, the operation being different from the offset point generation operation for other vertices.

Figure 2:
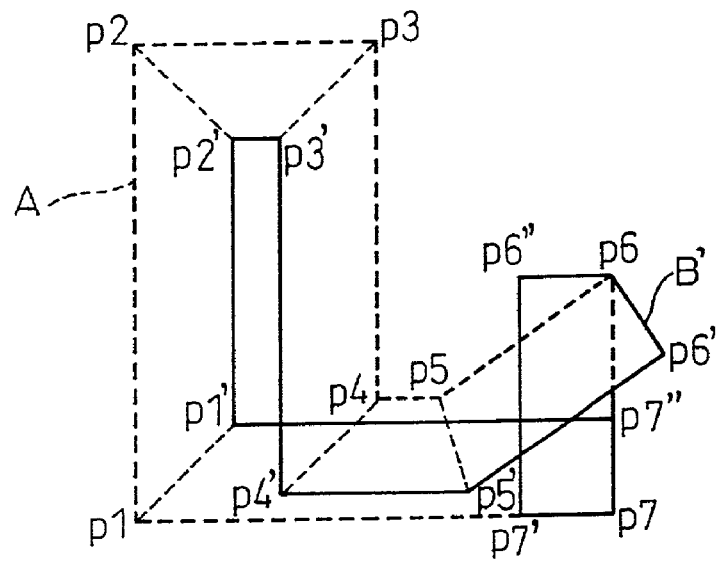
FIG. 2 is a diagram for explaining how an offset figure is re-created for a portion where the occurrence of an inside-out side is detected when offset processing is performed by translating the respective sides of a geometric figure.

For the vertices p6 and p7 of the source figure A associated with the inside-out side (p6', p7'), the offset points are recalculated based on the sides (p5', p6'), (p6", p7'), and (p7", p1') obtained by translating the corresponding sides by a distance equal to the prescribed sizing amount. The result is shown in FIG. 2.

End points p6' and p6" of the sides (p5', p6') and (p6", p7'), corresponding to the vertex p6, are taken as the offset points for the vertex p6, while end points p7' and p7" of the sides (p6", p7') and (p7", p1'), corresponding to the vertex p7, are taken as the offset points for the vertex p7. The offset point set for the vertex p6 therefore consists of the points p6', p6, and p6", while the offset point set for the vertex p7 consists of the points p7', p7, and p7". Accordingly, the points p1', p2', p3', p4', p5', p6', p6, p6", p7', p7, and p7" are taken as the offset points for the respective vertices of the source figure A, and the offset figure B' shown in FIG. 2 is generated by sequentially connecting these offset points.

Figure 3:
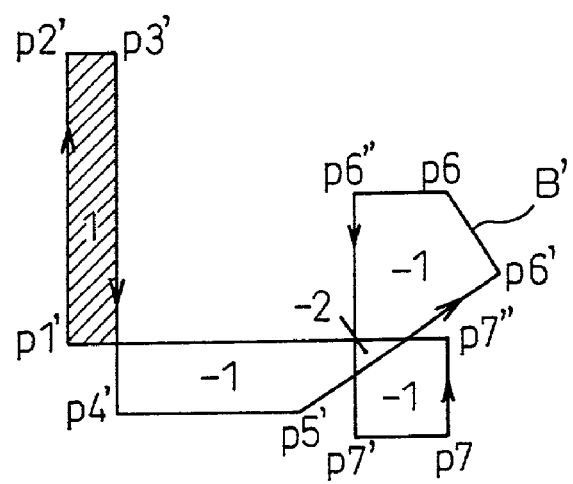
FIG. 3 is a diagram for explaining the result of OR processing performed on the offset figure shown in FIG. 2.

The OR processing is performed on the thus generated offset figure B'. The result of this processing is shown in FIG. 3. The region where the number of figure overlaps is 1 or larger is indicated by oblique hatching. This region is the figure that remains, and that can be extracted after performing the reduction processing on the source figure A. The extracted figure here corresponds to the geometric figure B2 shown in FIG. 11B.

The sizing processing method of this embodiment has been described by taking an example in which reduction processing is applied to the source figure A shown in FIG. 11A, but it will be appreciated that when applying enlargement processing as shown in FIG. 11C, the sizing processing can be performed in a manner similar to the reduction processing. However, in the case of enlargement processing, as opposed to the case of reduction processing, as an inside-out offset side occurs in association with a concave vertex of the source figure, the offset figure generation that avoids the inside-out side is performed for such a concave vertex.

Now, a description will be given of the computational order that indicates the computational complexity in the sizing processing method of this embodiment.

Generally, in sizing processing, the computational order for offset processing is $O(N)$ where N is the number of vertices of the source figure, and the computational order for OR processing is $O(M \log M)$ where M is the number of vertices of the offset figure. These computational order expressions also apply to the sizing processing method of this embodiment, and therefore, the computational order is determined by the number of vertices.

This means that the sizing processing method of this embodiment can achieve faster processing speed than the first sizing processing method, because the number of vertices of the offset figure is reduced for portions where no inside-out sides occur in the offset figure. When a comparison is made for the case where sizing processing is applied to the source figure of the same shape, for example, the source figure A of FIG. 11A, the number of vertices of the offset figure B generated by the first sizing processing shown in FIG. 13 is 17, while the number of vertices of the offset figure B' generated by the sizing processing of this embodiment shown in FIG. 2 is reduced to 11, thus achieving faster computational speed.

As described above, in the sizing processing method according to this embodiment, the second sizing processing is applied to the source figure, with provisions made to detect the occurrence of an inside-out side in the resulting offset figure and to re-generate an offset figure avoiding the occurrence of the inside-out side only for the portion where the occurrence of the inside-out side is detected; as a result, the offset processing speed can be increased without causing an overflow during calculation of an intersection point, and a correct result can be obtained even when applying such reduction processing that deliberately causes the figure to disappear.

EMBODIMENT 2

When producing a mask pattern for LSI circuit design, sizing processing is performed to shrink or enlarge geometric figures and, in some cases, processing may be performed to remove a notch or a protrusion, as previously noted. When removing a notch or a protrusion, or when it is enlarged to a larger size than necessary, an edge cut operation is performed during sizing processing.

The second embodiment shows that the sizing processing method of the first embodiment can also be used advantageously for the case where an edge cut shape is inserted in the offset figure during the sizing processing of the source figure.

The method of inserting an edge cut shape during the sizing processing of the source figure will be explained by taking the source figure A of FIG. 11A as an example.

Figure 4:
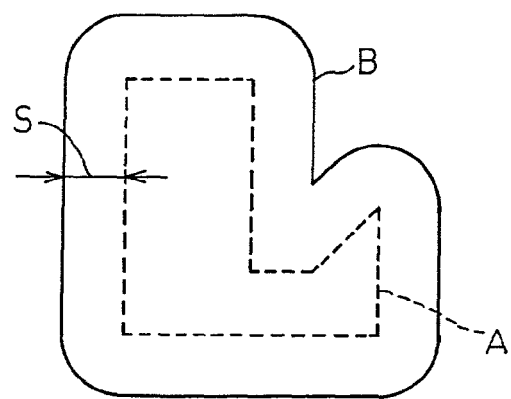
FIG. 4 is a diagram for explaining the result of ideal sizing processing.

FIG. 11C shows the result of the enlargement processing applied to the source figure A; on the other hand, FIG. 4 shows an ideal shape that would be obtained when enlargement processing with a prescribed sizing amount S was applied to the source figure A. As shown in FIG. 4, every convex vertex of the offset figure, after the sizing processing, has an arc shape.

Figure 5A:
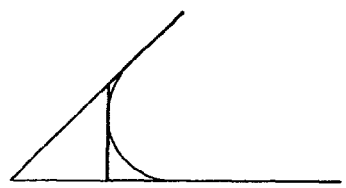
FIGS. 5A to 5C are diagrams for explaining examples of sizing processing when an edge cut approximated by a polygon is inserted.
Figure 5B:
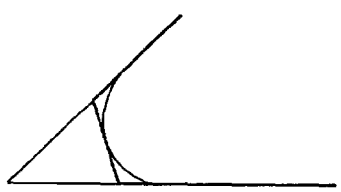
Figure 5C:

However, as the amount of computation increases to obtain such an arc shape, the offset shape of each convex vertex is formed by straight lines as shown in FIG. 11C. However, as shown in FIG. 5, the convex vertex of the source figure is enlarged to a greater extent than that defined by the sizing amount, and this phenomenon is particularly pronounced when the convex vertex forms a protrusion with an acute angle. To address this, an edge cut operation is applied to the offset figure corresponding to the protrusion by using a straight line or a polygon as shown in FIGS. 5A to 5C.

Figure 6A:
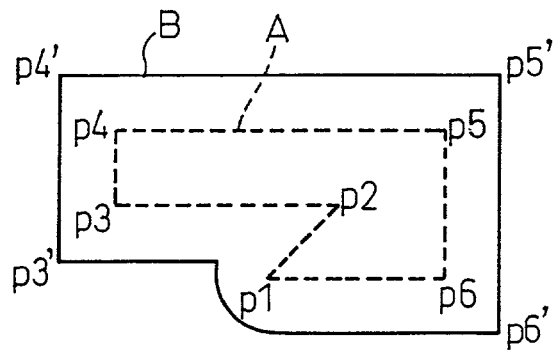
FIGS. 6A to 6C are diagrams for explaining a specific example of enlargement processing when the edge cut is inserted in a source figure.
Figure 6B:
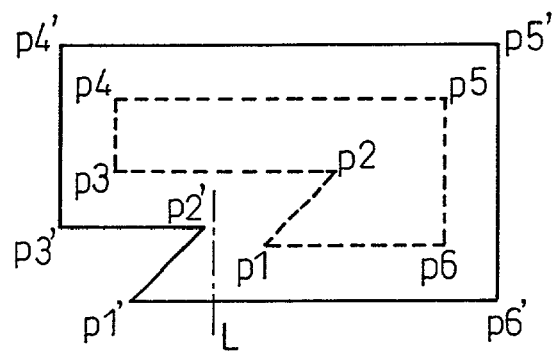
Figure 6C:
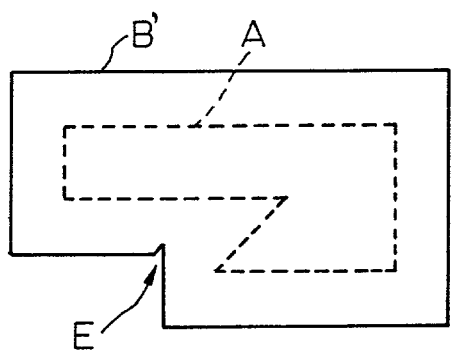

Next, FIGS. 6A to 6C show an example in which an edge cut is inserted when applying enlargement processing to a source figure differently shaped than the source figure shown in FIG. 4.

FIG. 6A shows an ideal offset figure B created by applying enlargement processing to the source figure A having vertices p1 to p6. FIG. 6B shows an offset figure created based on the intersection points formed when the sides of the source figure are translated, in contrast to the ideal offset figure B shown in FIG. 6A.

The offset figure shown in FIG. 6B is generated based on the offset point set consisting of p1', p2', p3', p4', p5', and p6'; however, since the offset point p1' for the protruding convex vertex p1 protrudes excessively in the offset figure, an edge cut operation using a vertical line, such as shown in FIG. 5A, is inserted to input the vertical line L.

As a result, the offset point p1 is deleted, and an offset figure B' containing the vertical line L is generated as shown in FIG. 6C. This, however, leads to the formation of an unwanted dent E in the offset FIG. B' at the position corresponding to the concave vertex p2 of the source figure A.

To address this, provisions are made in the second embodiment to prevent the formation of such a dent E in the offset figure when an edge cut operation is inserted in the sizing processing. The above description has dealt with the case of enlargement processing, but in the case of reduction processing also, a dent will be formed by the insertion of an edge cut operation, in this case, at the position corresponding to a concave vertex.

Figure 7:
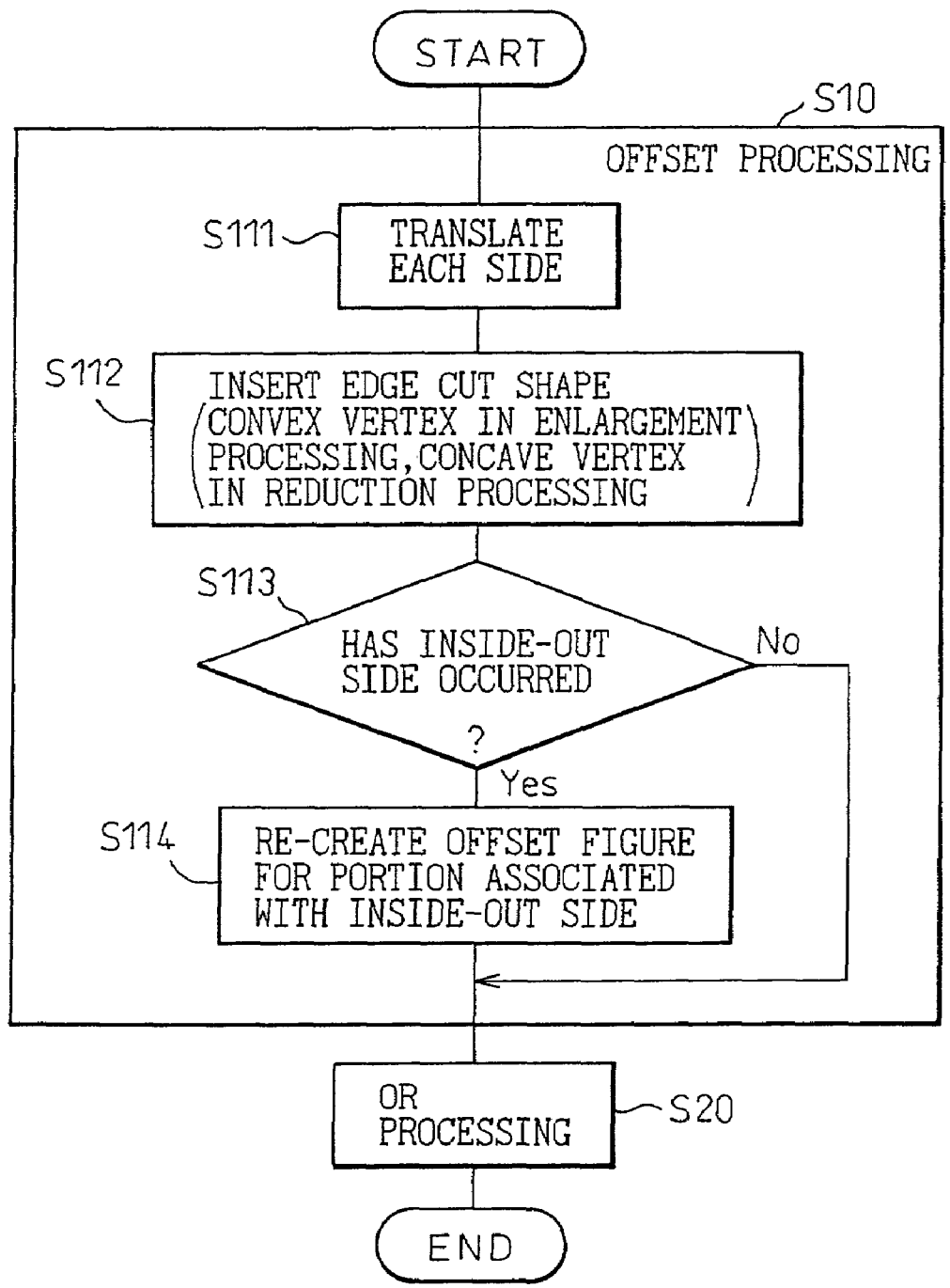
FIG. 7 is a flowchart for explaining a sizing processing procedure in which the edge cut is inserted in sizing processing according to a second embodiment.

FIG. 7 shows a flowchart illustrating the processing method used in the sizing processing system of the second embodiment in which an edge cut shape is inserted.

The processing method used in the sizing processing system of the second embodiment is fundamentally the same as that used in the sizing processing system of the first embodiment, the only difference being the inclusion of step S112 which performs an edge cut shape inserting operation when an offset figure is generated from the source figure. Steps S111, S113, and S114 in the flowchart of FIG. 7 respectively correspond to the steps S101, S102, and S103 in the flowchart of FIG. 1, and perform similar processing operations to those performed in the corresponding steps.

A specific application example of the sizing processing method of this embodiment that performs an edge cut shape insertion will be described below with reference to FIGS. 8 and 9.

Figure 8A:
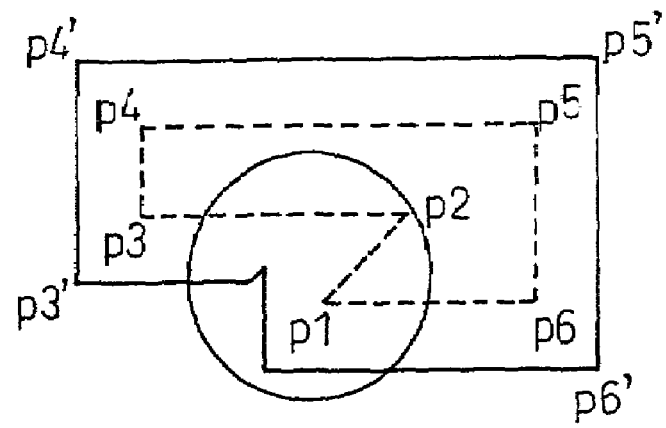
FIGS. 8A and 8B are diagrams for explaining the result when the enlargement processing of the second embodiment is applied to the source figure shown in FIG. 6.

FIG. 8A shows the same state as FIG. 6C. More specifically, after creating the offset figure B by applying enlargement processing, with a prescribed sizing amount, to the source figure A, the vertical line L for inserting an edge cut shape is added, as shown in FIG. 6B, and the offset figure B' shown in FIG. 8A is generated by inserting the edge cut shape. This offset figure B' contains a dent E formed due to the addition of the vertical line L.

Figure 8B:
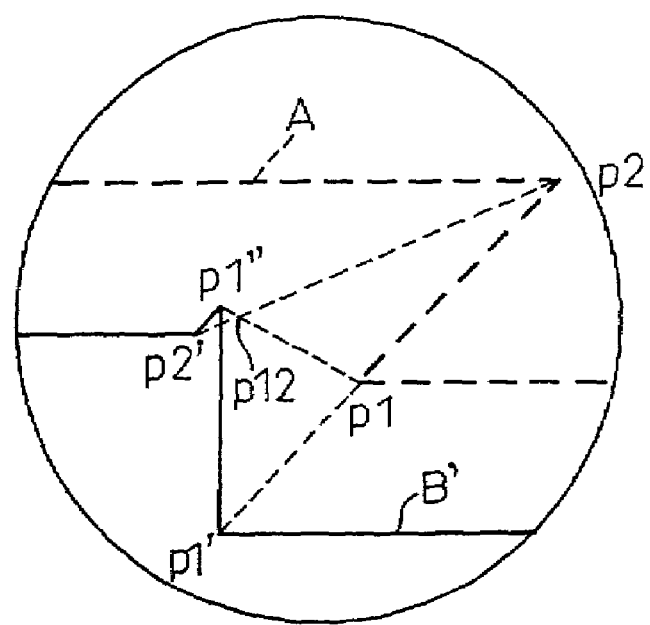

FIG. 8B shows an enlarged view of the dent E, illustrating how the dent is formed.

First, the respective sides of the source figure A are translated by a distance equal to the prescribed sizing amount, and the intersection point formed by any two sides thus translated is taken as an offset point, to generate a set of offset points p1', p2', p3', p4', p5', and p6' and create the offset figure B. Then, as shown in FIG. 6B, the vertical line L is added at a position distanced away from the convex vertex p1 of the source figure A by the prescribed sizing amount. Next, the points at which the translated sides of the two sides intersecting at the convex vertex p1, or the extended lines of the translated sides, intersect the vertical line L are obtained, and these intersection points are taken as new offset points. In FIG. 8B, the new offset points are shown at points p1' and p1". The offset point p1' is deleted from the previously generated offset point set consisting of p1', p2', p3', p4', p5', and p6', and the new offset points are added to generate a new set of offset points p1', p1", p2', p3', p4', p5', and p6'.

The offset figure B' can be generated by sequentially connecting the new offset points. Here, as can be seen from FIG. 8B, the offset side (p1", p2') is turned inside-out relative to its corresponding side (p1, p2) of the source figure A. This inside-out side can be said to be the cause for the dent E.

Here, when the new offset point set is obtained, offset locus line segments, each joining one offset point to the vertex of the source figure A corresponding to that offset point, are obtained and examined to detect whether any two adjacent offset locus line segments intersect each other, thereby determining whether an inside-out side has occurred. In the case of FIG. 8B, the two offset locus lines (p1, p1") and (p2, p2') are found to intersect at point p12, so that it is determined that the offset side (p1", p2') is an inside-out side.

Figure 9A:
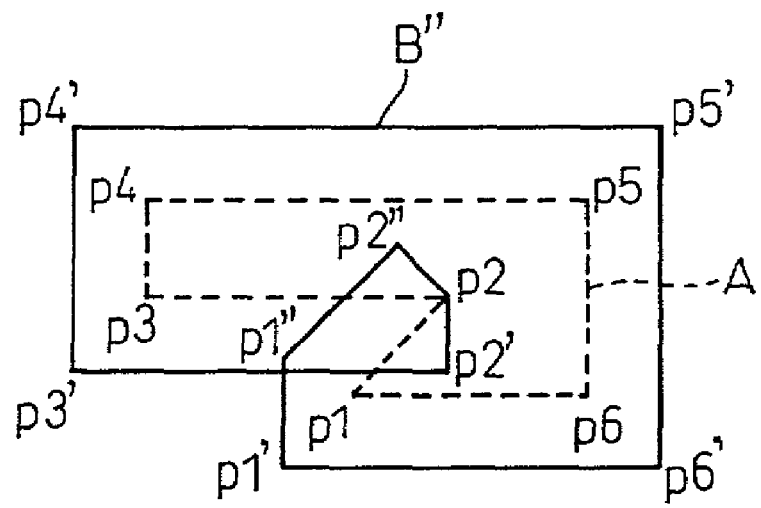
FIGS. 9A and 9B are diagrams for explaining the result of the OR processing performed on the offset figure created in FIG. 8.

For the portion of the source figure A for which the inside-out side has occurred, the sides (p1, p2) and (p2, p3) intersecting at the concave vertex p2 of the source figure A are translated by a distance equal to the sizing amount so as to prevent the occurrence of an inside-out side. The result is shown in FIG. 9A.

The offset point set generated at this time consists of points p1', p1", p2", p2, p2', p3', p4', p5', and p6'; by connecting these points sequentially, a new offset figure B" can be generated.

Figure 9B:
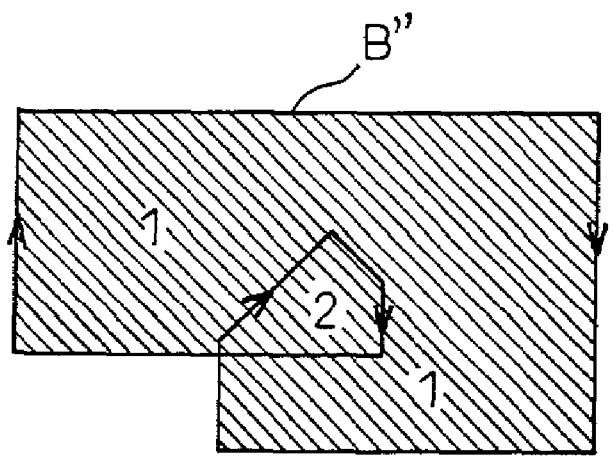

Then, when the OR processing is applied to the newly generated offset figure B", as shown in FIG. 9B, the region indicated by oblique hatching is obtained. This region is the final figure obtained by applying the enlargement processing to the source figure A and by inserting an edge cut shape.

The above procedure has been described by taking enlargement processing as an example, but the procedure can also be applied to the case of reduction processing; in that case, the edge cut shape is inserted in a concave vertex portion, otherwise the sizing processing procedure is the same as that for the enlargement processing.

As described above, even when the shape generated by offsetting the source figure contains a dent because of the insertion of an edge cut, a correct sizing shape with an edge cut can be obtained by applying the sizing processing method that generates an offset figure avoiding the inside-out side for the inside-out portion contributing to the formation of the dent.

The sizing processing system of the embodiment described above is implemented, in a CAD apparatus or the like, by using a computer.

Figure 10:
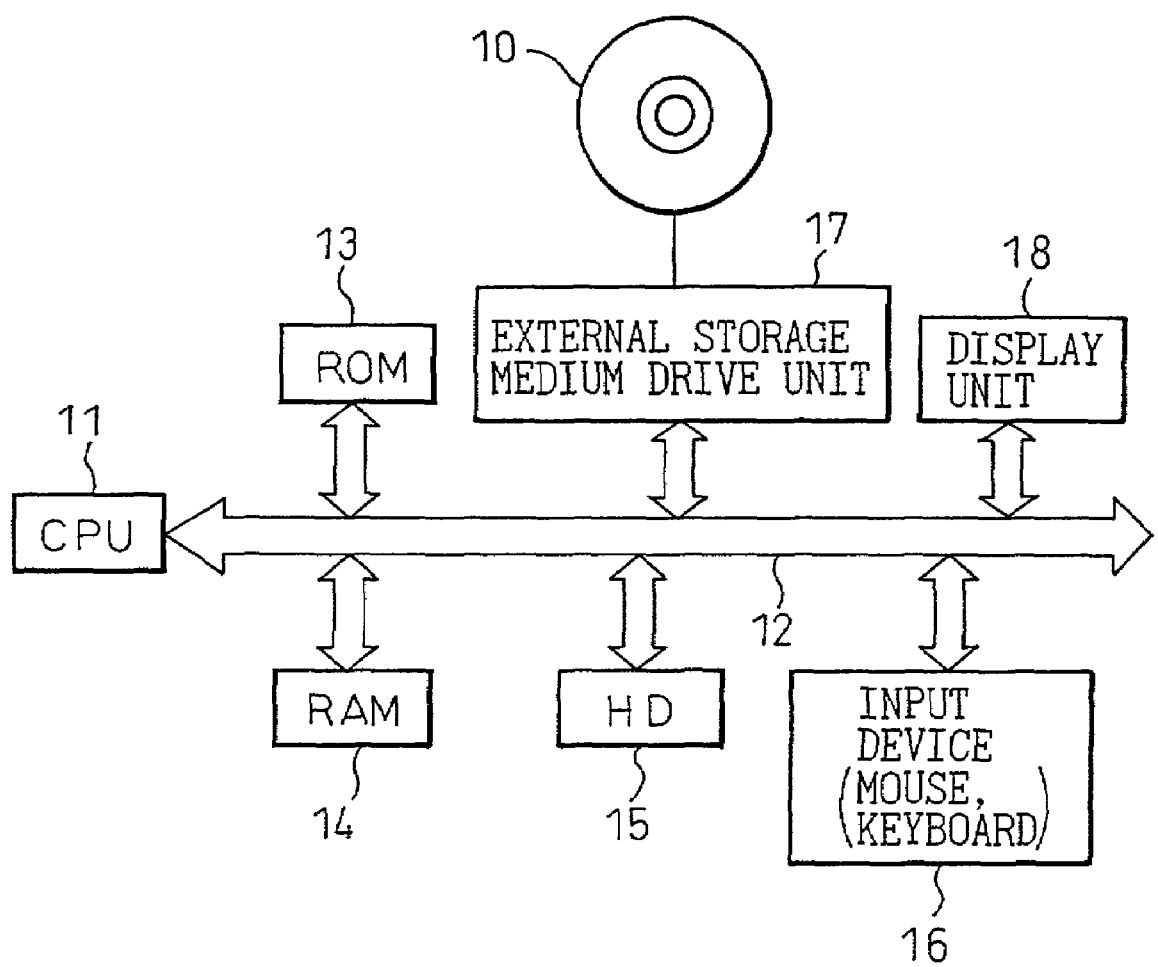
FIG. 10 is a block diagram showing the configuration of a sizing processing apparatus which operates in accordance with a program stored on a recording medium for executing sizing processing.

As shown in FIG. 10, the program to be executed by the computer is stored on a storage medium (external storage medium such as a floppy disk or a CD-ROM) 10, and is installed on the computer having the configuration described below as an example, causing the computer to operate as a CAD apparatus (sizing processing apparatus).

The configuration of the sizing processing apparatus using this computer will be briefly described below with reference to FIG. 10.

Reference numeral 11 is a CPU. The CPU 11 controls the entire operation of the sizing processing apparatus.

A ROM 13, a RAM 14, an HD (hard disk unit) 15, an input device 16 such as a mouse and keyboard, an external storage medium drive unit 17, and a display unit 18 such as an LCD or a CRT, are connected to the CPU 11 via a bus 12.

The control program for the CPU 11 is stored in the ROM 13.

The program for implementing the sizing processing method (the sizing processing program) is installed (loaded) from the storage medium 10 onto the HD 15. The RAM 14 provides a working area that the CPU 11 uses when executing the sizing processing method, as well as an area in which part of the program implementing the sizing processing method is temporarily stored.

Input data, final data, an OS (operating system), etc. are prestored on the HD 15.

When power is turned on to the computer, the CPU 11 reads the control program from the ROM 10, and further reads the OS from the HD 15 to start up the OS. The computer is thus set ready for the installation of the sizing processing program from the storage medium 10.

Next, the storage medium 10 is loaded into the external storage medium drive unit 17, a control command is input to the CPU 11 from the input device 16, and the sizing processing program stored on the storage medium 10 is read out and stored on the HD 15 or the like. That is, the sizing processing program is installed on the computer.

Thereafter, when the sizing processing program is started up, the computer operates as a sizing processing apparatus.

The operator can perform the above-described sizing processing by operating the input device 16 in interactive fashion in accordance with the work descriptions and procedures that the sizing processing program displays on the display unit 18.

In the computer of FIG. 10, the program stored on the storage medium 10 is installed on the HD 15, but alternatively, the program may be installed on the computer via an information transmission medium such as a LAN, or may be prestored on the HD 15 internal to the computer.

As described above, according to the sizing processing system of the present invention and the computer program for use with the same, since provisions are made to create an offset figure avoiding the generation of an inside-out side only for a portion where the occurrence of an inside-out side is detected, an overflow does not occurs during the calculation of an intersection point, and the offset processing speed can be increased. Further, even when performing such reduction processing that deliberately causes the figure to disappear, a correct result can be obtained.

Furthermore, even when an edge cut is inserted during the processing of the figure, the correct sizing figure free from a dent can be easily obtained by creating an offset figure avoiding the generation of an inside-out side.

What is claimed is:

1. A sizing processing system in a processor for generating a sizing figure by applying reducing or enlarging processing with a prescribed sizing amount to a source figure having a plurality of vertices, comprising:

an offset point set creating unit generating offset sides by offsetting said plurality of vertices of said source figure by a distance equal to a prescribed sizing amount, obtaining intersection points based on adjacent offset sides, and creating an offset point set corresponding to said plurality of vertices on said source figure based on said obtained intersection points;

an offset figure processing unit associated with said offset point set creating unit generating an offset figure by connecting offset points of said offset point set in the same order as said plurality of vertices of said source figure; and an inside-out side detecting unit associated with said offset figure processing unit detecting the occurrence of an inside-out side within said offset sides on said offset figure, wherein when said inside-out side detecting unit detects the occurrence of said inside-out side on said offset figure, said offset point set creating unit respectively offsets two adjacent sides of said source figure intersecting at the vertex on said source figure associated with the detected inside-out side, by the distance equal to said prescribed sizing amount, obtains new offset points corresponding to the original vertex of said source figure based on each end point of the current offset sides, and creates a new offset point set corresponding to said source figure by adding said new offset points to said offset point set.

2. A sizing processing system as claimed in claim 1, wherein when two adjacent offset locus line segments, each joining a vertex of said source figure to an offset point on said offset figure, intersect each other, said inside-out side detecting unit determines that said offset figure contains an inside-out side associated with said line segments.

3. A sizing processing system as claimed in any one of claims 1 to 2, wherein said offset point set creating unit includes an edge cut processing unit for inserting an edge cut in said offset figure, wherein when said inside-out side detecting unit detects the occurrence of said inside-out side on said offset figure, said edge cut processing unit adds an edge cut line at a position distant from the vertex on said source figure which associates with said detected inside-out side intended for edge cut processing, by the distance equal to said prescribed sizing amount, and said edge cut processing unit offsets two adjacent sides of said source figure intersecting at the relevant vertex, by the distance equal to said prescribed sizing amount, obtains intersection points at which said edge cut line intersects with offset sides corresponding to said two adjacent sides, and adds said intersection point as a new offset point to said offset point set.

4. A computer program operable within a computer to carry out sizing processing method for generating a sizing figure by applying reducing or enlarging processing of a prescribed sizing amount to a source figure having a plurality of vertices, the method comprising the following steps:

an offset point set creating step for generating offset sides by offsetting said plurality of vertices of said source figure by a distance equal to a prescribed sizing amount, obtaining intersection points based on adjacent offset sides, and creating an offset point set corresponding to said plurality of vertices on said source figure based on said intersection points;

an offset figure processing step for generating an offset figure by connecting offset points of said offset point set in the same order as said vertices of said source figure; and an inside-out side detecting step for detecting the occurrence of an inside-out side within said offset sides on said offset figure, wherein when the occurrence of said inside-out side on said offset figure is detected, two adjacent sides of said source figure intersecting at the vertex on said source figure associated with the detected inside-out side are respectively offset by the distance equal to said prescribed sizing amount, further new offset points corresponding to the original vertex of said source figure based on each end point of the current offset sides are obtained, and a new offset point set of said source figure is created by adding said new offset points.

5. The computer program sizing processing method as claimed in claim 4 wherein, when two adjacent offset locus line segments, each joining a vertex of said source figure to an offset point on said offset figure, intersect each other, said inside-out side detecting step determines that said offset figure contains an inside-out side associated with said line segments.

6. The computer program sizing processing method as claimed in any one of claims 4 to 5, wherein said offset point set creating step includes an edge cut processing step for inserting an edge cut processing in said offset figure, and wherein in said edge cut processing step, when the occurrence of said inside-out side on said offset figure is detected, and is in a region of said offset figure required to inserting said edge cut processing, an edge cut line is added at a position distant from the vertex on said source figure which associates with said detected inside-out side intended for edge cut processing, by the distance equal to said prescribed sizing amount, and wherein two adjacent sides of said source figure intersecting the relevant vertex are offset by the distance equal to said prescribed sizing amount, intersection points at which said edge cut line intersects said two adjacent sides are obtained, and said intersection points are added as new offset points to said offset point set.

* * * * *